(12) United States Patent
Zhou et al.

(10) Patent No.: US 12,245,371 B2
(45) Date of Patent: *Mar. 4, 2025

(54) ULTRA-THIN COMPOSITE TRANSPARENT CONDUCTIVE FILM AND PREPARATION METHOD THEREFOR

(71) Applicant: IVTOUCH CO., LTD, Suzhou (CN)

(72) Inventors: Xiaohong Zhou, Suzhou (CN); Liangliang Ji, Suzhou (CN); Yiming Yao, Suzhou (CN); Linsen Chen, Suzhou (CN)

(73) Assignee: IVTOUCH Co., LTD, Suzhou (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/371,393

(22) Filed: Sep. 21, 2023

(65) Prior Publication Data

US 2024/0023240 A1     Jan. 18, 2024

Related U.S. Application Data

(63) Continuation of application No. 17/279,703, filed as application No. PCT/CN2019/104195 on Sep. 3, 2019, now Pat. No. 11,805,598.

(30) Foreign Application Priority Data

Sep. 29, 2018   (CN) .......................... 201811145312.6
Sep. 29, 2018   (CN) .......................... 201821597394.3
Mar. 8, 2019   (CN) .......................... 201910174710.9

(51) Int. Cl.
*H05K 1/02*     (2006.01)
*B05D 3/06*     (2006.01)
(Continued)

(52) U.S. Cl.
CPC ........... *H05K 1/0298* (2013.01); *B05D 3/061* (2013.01); *B05D 3/12* (2013.01); *B05D 7/586* (2013.01);
(Continued)

(58) Field of Classification Search
CPC .... H05K 1/0298; H05K 3/107; G06F 3/0445; G06F 3/041; G06F 2203/04103;
(Continued)

(56) References Cited

U.S. PATENT DOCUMENTS 11,805,598 B2 *   10/2023   Zhou ..................... H01B 13/00
2003/0128440 A1     7/2003   Kimura
(Continued)

FOREIGN PATENT DOCUMENTS

CN     103279240 A     9/2013
CN     103295669 A     9/2013
(Continued)

OTHER PUBLICATIONS

International Search report received for PCT Patent Application No. PCT/CN2019/104195, mailed on Dec. 10, 2019, 5 pages including English translation.
(Continued)

*Primary Examiner* — Jimmy H Nguyen
(74) *Attorney, Agent, or Firm* — Zhong Law, LLC

(57) ABSTRACT

Disclosed is an ultra-thin composite transparent conductive film, including: a transparent substrate; a first UV glue layer disposed on one side of the transparent substrate, pattern-imprinted and cured to form a first grid-shaped groove, the first grid-shaped groove being filled with conductive materials to form a first conductive layer; a second UV glue layer disposed on one side of the first UV glue layer away from the transparent substrate to provide a reinforced insulating support layer; and a third UV glue layer disposed on one side
(Continued)

of the second UV glue layer away from the transparent substrate, pattern-imprinted and cured to form a second grid-shaped groove, the second grid-shaped groove being filled with conductive materials to form a second conductive layer, where a thickness of the reinforced insulating support layer is in a range of 5-10 micrometers.

13 Claims, 4 Drawing Sheets

(51) Int. Cl.
    *B05D 3/12*     (2006.01)
    *B05D 7/00*     (2006.01)
    *G06F 3/041*     (2006.01)
    *H05K 3/10*     (2006.01)

(52) U.S. Cl.
    CPC ............ *G06F 3/041* (2013.01); *H05K 3/107* (2013.01); *G06F 2203/04103* (2013.01); *H05K 2201/10128* (2013.01)

(58) Field of Classification Search
    CPC ..... G03F 7/0002; G03F 7/0007; B05D 3/067; B05D 3/061; B05D 3/12; B05D 5/12; B05D 7/586; B05D 7/576; B05D 7/04; H01B 5/14
    USPC .................................................. 345/173, 174
    See application file for complete search history.

(56) References Cited

U.S. PATENT DOCUMENTS

| | | |
|---|---|---|
| 2011/0090172 A1 | 4/2011 | Kaya et al. |
| 2011/0134646 A1 | 6/2011 | Yang et al. |
| 2014/0253824 A1 | 9/2014 | He |
| 2014/0353012 A1 | 12/2014 | Zhao et al. |
| 2014/0354901 A1 | 12/2014 | Zhao et al. |
| 2014/0360757 A1 | 12/2014 | Gao et al. |
| 2019/0193374 A1 | 6/2019 | Yamasaki et al. |

FOREIGN PATENT DOCUMENTS

| | | |
|---|---|---|
| CN | 104347153 A | 2/2015 |
| CN | 204331676 A | 5/2015 |
| CN | 106710669 A | 5/2017 |
| KR | 20110123232 A | 11/2011 |
| KR | 101544715 B1 | 8/2015 |
| KR | 101564041 B1 | 10/2015 |
| KR | 101571617 B1 | 11/2015 |
| WO | 2020/063272 A1 | 4/2020 |

OTHER PUBLICATIONS

Office Action issued for Korea Patent Application No. 10-2021-7007059 mailed on Jan. 11, 2023, 15 Pages.

1st Office Action issued for Chinese Patent Application No. 201910174710.9, mailed on Nov. 29, 2024, 14 Pages.

\* cited by examiner

ULTRA-THIN COMPOSITE TRANSPARENT CONDUCTIVE FILM AND PREPARATION METHOD THEREFOR

CROSS-REFERENCE TO RELATED APPLICATIONS

This application is a continuation of U.S. application Ser. No. 17/279,703, filed Mar. 25, 2021, which is the U.S. stage of International Application PCT/CN2019/104195, filed Sep. 3, 2019, which claims priority from China Patent Application No. 201811145312.6, filed Sep. 29, 2018, China Patent Application No. 201821597394.3, filed Sep. 29, 2019, and China Patent Application No. 201910174710.9 filed Mar. 8, 2019. The above-mentioned patent applications are hereby incorporated by reference in their entirety.

FIELD OF THE INVENTION

The present invention relates to the technical field of conductive films, and particularly relates to an ultra-thin composite transparent conductive film and a preparation method therefor, and products using the conductive film.

BACKGROUND TECHNIQUE

A transparent conductive film is a film with good electrical conductivity and high light transmittance in visible light bands. It has been widely used in the fields including flat panel display, photovoltaic devices, touch panels and electromagnetic shielding, and has a broad market space. Due to various drawbacks of ITO, flexible low-resistance metal mesh transparent conductive films are playing an increasingly important role.

The transparent conductive film in the prior art refers to "a conductive film that can achieve some specific electronic functions". Generally, a conductive layer is prepared on a transparent substrate, which usually includes a transparent substrate layer and a related metal embedded layer. The surface of the transparent substrate layer has a patterned and communicated trench network, and conductive materials are filled in the trench network to form a conductive film.

The existing transparent conductive film forms a single conductive layer on the surface of the substrate, and such conductive structure only has the conductive function of a general conductive film, and does not have the circuit function of a proprietary sensor. For example, for a mutual-capacitance type capacitive touch sensor with upper and lower electrodes, it needs to go through post-processes such as adding a lead region, and it is necessary to combine two layers of circuit films after post-process processing with an optical adhesive to form a touch sensor.

In a transparent conductive film preparation method in the prior art, a micro-structure is prepared by using a micro-machining process such as photolithography, a groove is formed by imprinting technology, and the groove is filled with conductive ink and sintered. The single transparent conductive film prepared by this preparation step does not consider the material deformation caused by the technical process, which leads to the problem of size deformation of a capacitor electrode pattern. In actual production of mass products, there are problems such as low yield and high cost.

The production of conductive films in the prior art usually has the following technical problems: the production processes are complicated, the product quality cannot be stably controlled, and the yield is low. In particular, the current capacitive screen basically uses the process of attaching two transparent conductive films to each other, the product thickness is limited, which does not conform to the current development trend of ultra-light and ultra-thin touch screens, and the cost is high. In the future, an electronic apparatus will gradually develop in the direction of curved design and flexible screen design, but the touch module made of two transparent conductive films attached to each other has poor bending resistance.

Therefore, the present invention proposes a functional transparent conductive film with a multi-layer composite structure and a preparation method, so as to solve the defects of the existing product structure and preparation method.

SUMMARY OF THE INVENTION

In order to overcome the defects in the prior art and solve the problems in the prior art, an ultra-thin composite transparent conductive film is provided in the present invention. The ultra-thin composite transparent conductive film has a simple structure and a simplified and stable preparation process, a reduced preparation cost, and can be used widely.

In order to solve the above problems, an ultra-thin composite transparent conductive film is provided according to one aspect of the present invention. The ultra-thin composite transparent conductive film includes a transparent substrate; a first UV glue layer disposed on one side of the transparent substrate, pattern-imprinted and cured to form a first grid-shaped groove and a first lead groove, the first grid-shaped groove and the first lead groove being filled with conductive materials to form a first conductive layer and a first lead region respectively, depth of the first grid-shaped groove and the first lead groove being smaller than a thickness of the first UV glue layer; a second UV glue layer disposed on one side of the first UV glue layer away from the transparent substrate and used as a reinforced insulating support layer; and a third UV glue layer disposed on one side of the second UV glue layer away from the transparent substrate, pattern-imprinted and cured to form a second grid-shaped groove and a second lead groove, the second grid-shaped groove and the second lead groove being filled with conductive materials to form a second conductive layer and a second lead region respectively, and depth of the second grid-shaped groove and the second lead groove being not greater than a thickness of the third UV glue layer.

As a preferred embodiment of the ultra-thin composite transparent conductive film of the present invention, the first UV glue layer is pattern-imprinted and cured to form the first grid-shaped groove, the first lead groove, and a first alignment pattern groove, the first alignment pattern groove is filled with conductive materials to form a first alignment mark, and the depth of the first grid-shaped groove, the first lead groove, and the first alignment pattern groove is smaller than the thickness of the first UV glue layer; the third UV glue layer is pattern-imprinted and cured to form the second grid-shaped groove, the second lead groove, and a second alignment pattern groove, the second alignment pattern groove is filled with conductive materials to form a second alignment mark, and the depth of the second grid-shaped groove, the second lead groove, and the second alignment pattern groove is not greater than the thickness of the third UV glue layer; and patterns of the first alignment mark and the second alignment mark are retained or cut in a transparent conductive film product.

As a preferred embodiment of the ultra-thin composite transparent conductive film of the present invention, a thickness of the second UV glue layer is 1-10 micrometers.

As a preferred embodiment of the ultra-thin composite transparent conductive film of the present invention, materials of the second UV glue layer and the third UV glue layer are different, and materials of the first UV glue layer and the third UV glue layer are the same or different.

As a preferred embodiment of the ultra-thin composite transparent conductive film of the present invention, an electrical connection region of the first lead region is not covered with the second UV glue layer, and an electrical connection region of the second lead region does not overlap with the electrical connection region of the first lead region.

As a preferred embodiment of the ultra-thin composite transparent conductive film of the present invention, a tackifying layer is coated or a tackifying process is performed between the transparent substrate and the first UV glue layer; and/or a tackifying layer is coated or a tackifying process is performed between the first UV glue layer and the second UV glue layer; and/or a tackifying layer is coated or a tackifying process is performed between the second UV glue layer and the third UV glue layer.

As a preferred embodiment of the ultra-thin composite transparent conductive film of the present invention, the second UV glue layer is a composite layer formed by coating UV curing glue on the one side of the first UV glue layer multiple times, the electrical connection region of the first lead region is not covered with the second UV glue layer, the third UV glue layer is formed by coating a layer of UV curing glue on the one side of the second UV glue layer, and the first UV glue layer is formed by coating a layer of UV curing glue on the one side of the transparent substrate.

As a preferred embodiment of the ultra-thin composite transparent conductive film of the present invention, the first grid-shaped groove, the second grid-shaped groove, the first lead groove, and the second lead groove are filled with nano silver paste, nano copper paste, graphene materials, nano silver wires or carbon nanotube materials.

As a preferred embodiment of the ultra-thin composite transparent conductive film of the present invention, the ultra-thin composite transparent conductive film further comprises: a protective layer provided on an upper surface of the third UV glue layer, wherein the protective layer is a polymer layer, the first UV glue layer, the second UV glue layer, the third UV glue layer, the protective layer, and the transparent substrate together form a composite transparent conductive film, and the electrical connection region of the second lead region does not overlap with the electrical connection region of the first lead region.

According to another aspect of the present invention, a preparation method of an ultra-thin composite transparent conductive film is provided. The preparation method includes: coating on one side of a transparent substrate with a first layer of UV curing glue, and pattern-imprinting and curing the first layer of UV curing glue to form a first grid-shaped groove, a first lead groove, and a first alignment pattern groove; filling the first grid-shaped groove, the first lead groove, and the first alignment pattern groove with conductive materials to form a first conductive layer, a first lead region and a first alignment marker respectively so that a first UV glue layer is obtained, depth of the first grid-shaped groove and the first lead groove being smaller than a thickness of the first UV glue layer; coating one side of the first UV glue layer with a second layer of UV curing glue selectively to form a second UV glue layer, an electrical connection region of the first lead region being not coated with the second layer of UV curing glue; coating one side of the second UV glue layer with a third layer of UV curing glue, and pattern-aligned imprinting and curing the third layer of UV curing glue to form a second grid-shaped groove, a second lead groove, and a second alignment pattern groove; and filling the second grid-shaped groove, the second lead groove, and the second alignment pattern groove with conductive materials to form a second conductive layer, a second lead region and a second alignment marker respectively so that a third UV glue layer is obtained, depth of the second grid-shaped groove and the second lead groove being not greater than a thickness of the third UV glue layer, and an electrical connection region of the second lead region not overlapping with the electrical connection region of the first lead region According to still another aspect of the present invention, a structure of an ultra-thin composite transparent conductive film is provided. The structure includes a transparent substrate; a first UV glue layer formed by coating a first layer of UV curing glue on one side of the transparent substrate, the first layer of UV curing glue being pattern-imprinted and cured to form a first grid-shaped groove, the first grid-shaped groove being filled with conductive materials to form a first conductive layer, depth of the first grid-shaped groove being smaller than a thickness of the first UV glue layer; a second UV glue layer formed by coating and curing a second layer of UV curing glue on one side of the first UV glue layer away from the transparent substrate and used as a reinforced insulating support layer; and a third UV glue layer formed by coating a third layer of UV curing glue on one side of the second UV glue layer away from the transparent substrate, the third layer of UV curing glue being pattern-imprinted and cured to form a second grid-shaped groove, the second grid-shaped groove being filled with conductive materials to form a second conductive layer, and depth of the second grid-shaped groove being not greater than a thickness of the third UV glue layer.

According to still another aspect of the present invention, a touch panel is provided. The touch panel, comprises: a glass cover plate; a first UV glue layer formed by coating a layer of UV curing glue on one side of the glass cover plate, pattern-imprinted and cured to form a first grid-shaped groove and a first lead groove, the first grid-shaped groove and the first lead groove being filled with conductive materials to form a first conductive layer and a first lead region respectively, depth of the first grid-shaped groove and the first lead groove being smaller than a thickness of the first UV glue layer; a second UV glue layer disposed on one side of the first UV glue layer away from the glass cover plate and used as a reinforced insulating support layer; and a third UV glue layer disposed on one side of the second UV glue layer away from the glass cover plate, pattern-imprinted and cured to form a second grid-shaped groove and a second lead groove, the second grid-shaped groove and the second lead groove being filled with conductive materials to form a second conductive layer and a second first lead region respectively, and depth of the second grid-shaped groove and the second lead groove being not greater than a thickness of the third UV glue layer.

According to still another aspect of the present invention, a large-size touch all-in-one machine apparatus is provided. The large-size touch all-in-one machine apparatus, comprises: a CPU; a power supply; a display device comprising a touch panel comprising an ultra-thin composite transparent conductive film, the ultra-thin composite transparent conductive film comprising: a transparent substrate; a first UV glue layer formed by coating a layer of UV curing glue on one side of the transparent substrate, pattern-imprinted and cured to form a first grid-shaped groove and a first lead groove, the first grid-shaped groove and the first lead groove being filled with conductive materials to form a first conductive layer and a first lead region respectively, depth of the first grid-shaped groove and the first lead groove being smaller than a thickness of the first UV glue layer; a second UV glue layer disposed on one side of the first UV glue layer away from the transparent substrate and used as a reinforced insulating support layer; and a third UV glue layer disposed on one side of the second UV glue layer away from the transparent substrate, pattern-imprinted and cured to form a second grid-shaped groove and a second lead groove, the second grid-shaped groove and the second lead groove being filled with conductive materials to form a second conductive layer and a second lead region respectively, and depth of the second grid-shaped groove and the second lead groove being not greater than a thickness of the third UV glue layer.

According to still another aspect of the present invention, a composite transparent conductive film is provided. A composite transparent conductive film, comprises: a transparent substrate having a first grid-shaped groove and a first lead groove formed by pattern-imprinting one side thereof, the first grid-shaped groove and the first lead groove being filled with conductive materials to form a first conductive layer and a first lead region; a second UV glue layer disposed on the one side of the transparent substrate and used as a reinforced insulating support layer, and an electrical connection region of the first lead region being not coated with the second UV glue layer; and a third UV glue layer disposed on one side of the second UV glue layer away from the transparent substrate, pattern-imprinted and cured to form a second grid-shaped groove and a second lead groove, the second grid-shaped groove and the second lead groove being filled with conductive materials to form a second conductive layer and a second lead region respectively, and depth of the second grid-shaped groove and the second lead groove being not greater than a thickness of the third UV glue layer.

The applicant of the present invention has been engaged in using a nano-imprint technology to imprint grooves for embedding conductive metal particles and grids for light transmission on a transparent substrate for a long time. By designing width and depth of the groove and proportion of the groove in the entire transparent conductive film, a transparent conductive film with high light transmittance and good electrical conductivity is obtained. Based on the previous technology accumulation, various solutions that have not worked well have been tried before obtaining the technical solution of the present invention.

One of the research and development solutions is to directly dispose a double-layer or multi-layer patterned transparent conductive film structure on one surface of a transparent substrate. Although this technical solution is good theoretically, as long as the thickness of an upper transparent glue layer is controlled to be greater than the depth of an upper conductive layer, two conductive layers can be insulated from each other. In fact, it is found that this technical solution has too low yield and does not have feasibility of mass production after a large number of experiments have been done. The details refer to the experimental data and analysis in the specific embodiment section.

After many improvements and continuous attempts, the technical solution of the present invention is obtained. The technical solution of the present invention at least has the following beneficial technical effects:

1. In the ultra-thin composite transparent conductive film of the present invention, a separate reinforced insulating support layer is creatively used to isolate the first conductive layer from the second conductive layer, the second conductive layer is disposed in the third UV glue layer, and the third UV glue layer is disposed on the second UV glue layer (as the reinforced insulating support layer), so that the insulation effect between the first conductive layer and the second conductive layer can be greatly improved, and the short circuit problem of the conductive layer can be effectively prevented.

According to the research and development reference example shown in FIG. 2 of the present invention, a double-layer patterned transparent conductive film structure is directly disposed on a transparent substrate. It will be found that the yield is very low and there are a large number of short-circuit problem between the conductive layers. These problems may be caused by various factors such as high-temperature treatment cracking, solvent volatilization, and defects formed in polymers. The deep-seated reason is that the processing of polymer materials involved in the products and method of the present invention is an interdisciplinary technology, and the processing of polymer materials involves the intersection of multiple subjects, such as polymer chemistry, chemical engineering, polymer physics, engineering thermophysics, and process control. The properties of polymer materials are usually closely related to its chemical structure, but the chemical structure can be influenced by the processing technology of the polymer materials. Therefore, many seemingly subtle changes in processing technology often have unexpected changes in yield quality control of the polymer materials.

The second UV glue layer disposed separately in the present invention can effectively solve the above problems and gets better technical effects. For example, in the research and development reference example shown in FIG. 2 of the present invention, the second conductive layer is directly disposed on the first conductive layer of the first UV glue layer, and various factors in processing of the polymer materials lead to penetration of conductive materials. Therefore, it is easy to cause short-circuit problems, the yield is too low, and actual mass production cannot be achieved.

In the present invention, a reinforced insulating support layer is separately disposed to achieve a certain smoothing effect, and then, the third UV glue layer is coated on the cured second UV glue layer. The surface of the third UV glue layer is pattern-imprinted and filled with conductive material to form the second conductive layer. Since the first conductive layer and the second conductive layer are separated by the third UV glue layer as well as the cured second UV glue layer, the problem of the short circuit between the two conductive layers is difficult to occur, so as to greatly improve the yield of the product.

According to the experimental data, it can be known that the technical effect of disposing a separate reinforced insulating support layer is significantly more effective than that of increasing the thickness of the third UV glue layer alone.

At the same time, in the technical solution of the present invention, the first UV glue layer and the third UV glue layer can be appropriately thinned on the premise that the original thickness of a conductive film product is controlled to be unchanged or thinner, and a thickness space is reserved for the separate second UV glue layer for insulated isolation, so that the entire electronic product is thinner.

2. The reinforced insulating support layer added in the present invention plays a role in reinforced insulation on the one hand. At the same time, this layer structure and the upper and lower conductive layers together form a composite layer structure which increases bending resistance of the conductive film, further improves the stability of the product, also expands application scenarios of the product, and is suitable for multi-touch requirements of flexible screens, and the like.

3. The present invention further provides a preparation method for producing the ultra-thin composite transparent conductive film, which can prepare the ultra-thin composite transparent conductive film in a large scale, simplifies the preparation process, improves the yield, improves the production efficiency of the product, and reduces the cost of the product.

BRIEF DESCRIPTION OF THE DRAWINGS

The drawings described herein are provided to further understand the present invention, and are intended to be a part of this application. In the drawing.

DETAILED DESCRIPTION OF THE INVENTION

Figure 1:
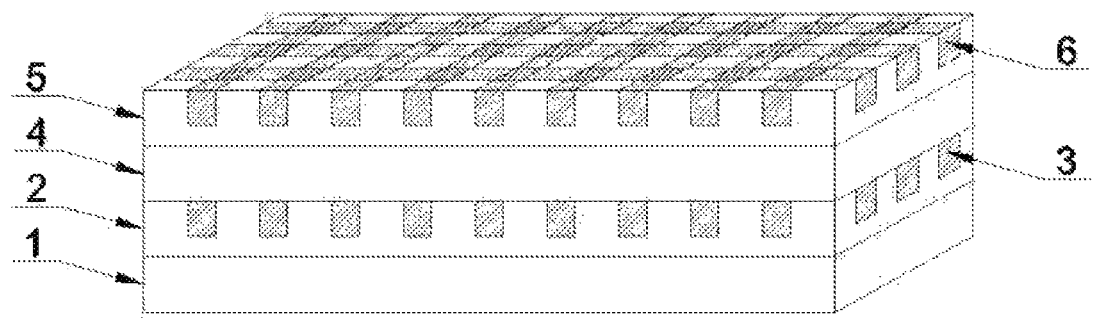
FIG. 1 is a schematic diagram of a three-dimensional structure of an ultra-thin composite transparent conductive film according to a first embodiment of the present invention.

The present invention will be described in detail below with reference to the accompanying drawings 1-7 and implementations, wherein 1 denotes a transparent substrate; 2 denotes a first UV (Ultraviolet Rays) glue layer; 3 denotes a first conductive layer; 4 denotes a second UV glue layer (namely a reinforced insulating support layer); 5 denotes a third UV glue layer; 6 denotes a second conductive layer (protective layer not shown in the drawings and capable of enhancing wear resistance and preventing metal oxidation or sulfuration, etc.); 7 denotes an electrical connection region of a first lead region; 8 denotes an electrical connection region of a second lead region.

The terms such as the first UV glue layer, the second UV glue layer and the third UV glue layer mentioned in the present invention are used to distinguish each layer structure, and do not mean that the layer structure only has UV glue. For example, the first third UV glue layer and the third UV glue layer include conductive structures according to their structure descriptions. The first UV glue layer may also be called as a first transparent glue layer, the second UV glue layer may also be called as a transparent insulating support layer, and the third UV glue layer may also be called as a second transparent glue layer.

FIG. 1 is a schematic diagram of a three-dimensional structure of an ultra-thin composite transparent conductive film according to a first embodiment of the present invention. As shown in FIG. 1, the present embodiment discloses an ultra-thin composite transparent conductive film. The ultra-thin composite transparent conductive film includes a transparent substrate 1, a first UV glue layer 2 disposed on one side of the transparent substrate 1, pattern-imprinted and cured to form a first grid-shaped groove, a second UV glue layer 4 disposed on one side of the first UV glue layer 2 away from the transparent substrate 1 and used as a reinforced insulating support layer, and a third UV glue layer 5 disposed on one side of the reinforced insulating support layer 4 away from the transparent substrate 2, pattern-imprinted and cured to form a second grid-shaped groove. The first grid-shaped groove is filled with conductive materials to form a first conductive layer 3. The second grid-shaped groove is filled with conductive materials to form a second conductive layer 6.

Figure 3:
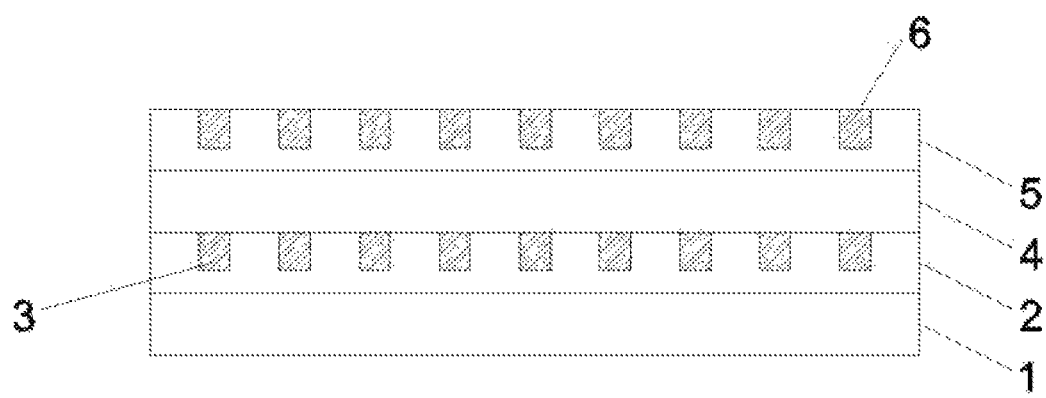
FIG. 3 is a schematic diagram of a cross-sectional structure of the ultra-thin composite transparent conductive film according to the first embodiment of the present invention.

It should be noted that the third UV glue layer 5 including the second conductive layer 6 is disposed on the cured second UV glue layer 4, which can greatly improve insulation strength between the first conductive layer 3 and the second conductive layer 6, and avoid the problem of conductive layer penetration. As shown in FIG. 3, the third UV glue layer 5 is formed and imprinted on the cured transparent reinforced insulating support layer 4, and the third UV glue layer is cured and then filled with conductive materials to form the second conductive layer 6, so that the problem of the short circuit between two conductive layers is difficult to occur, so as to greatly improve the yield of the product.

The transparent substrate is a polymer layer commonly used for a conductive film. It should be noted that the materials of the first UV glue layer 2, the third UV glue layer 5 and the second UV glue layer 4 may be UV curing glue and thermosetting coatings, and the UV curing glue are preferred. The cured surfaces of the first UV glue layer 2 and the third UV glue layer 5 are as smooth as possible. For example, the friction coefficient of the cured surfaces of the first UV glue layer 2 and the third UV glue layer 5 is 0.1-0.4, which is convenient for filling conductive materials by scraping. The surface of the second UV glue layer 4, that is, the reinforced insulating support layer, has a certain roughness after curing, and the friction coefficient of the surface of the second UV glue layer 4 is 0.4-1.0 preferably, so that the reinforced insulating support layer has sufficient adhesion, and the viscosity between the first UV glue layer 2 and the third UV glue layer 5 is increased.

A tackifying layer is coated or a tackifying process is performed between any two layers of the transparent substrate 1, the first UV glue layer 2, the second UV glue layer 4 and the third UV glue layer 5 according to conventional technologies. The conventional tackifying layer cannot play roles in reinforced insulation and supporting itself. If the first UV glue layer 2, the third UV glue layer 5 and the second UV glue layer 4 all use the same UV curing glue, the tackifying process can be adopted or the tackifying layer can be disposed for better bonding. The main material of the tackifying layer conventionally used can be polyacetylene, polyaniline, polythiophene, graphene, polyethylene terephthalate, polyurethane, and the like. The tackifying layer is usually coated on the surface of a substrate to achieve the effect of bonding with an upper structure, and the coating thickness is 10-100 nm.

PET, polyimide (PI) or other material can be selected as materials of the transparent substrate 1 according to different application scenarios and requirement. In order to reinforce insulation between conductive layers, the preferred thickness of the reinforced insulating support layer 4 is 5-10 micrometers. After being pressed, the surface of the cured reinforced insulating support layer 4 is flat relatively, and there is no difference in thickness.

In the present invention, due to the insulation and support effects of the reinforced insulating support layer 4, the yield of the product can reach more than 90%. The details refer to FIG. 2, FIG. 3, FIG. 5, FIG. 6, and the following table descriptions.

An environmental test is performed after electrifying under the test conditions that the temperature is 85° C., the humidity is 85% RH and the time is 240 hours. A test method includes the following main operations: 1), a test sample is taken; 2), the appearance of the test sample is checked before testing, and whether the function of the test sample is qualified is confirmed; 3), the test sample is put into a test box and electrified under the test conditions that the temperature is 85° C., the humidity is 85% RH and the time is 240 hours; 4), after the test conditions are met, the test sample is taken out; 5), after the test sample is stationary for 24 hours, the appearance of the test sample is checked, and a function test is performed; and 6), after the test, the data is recorded in the following table.

Figure 5:
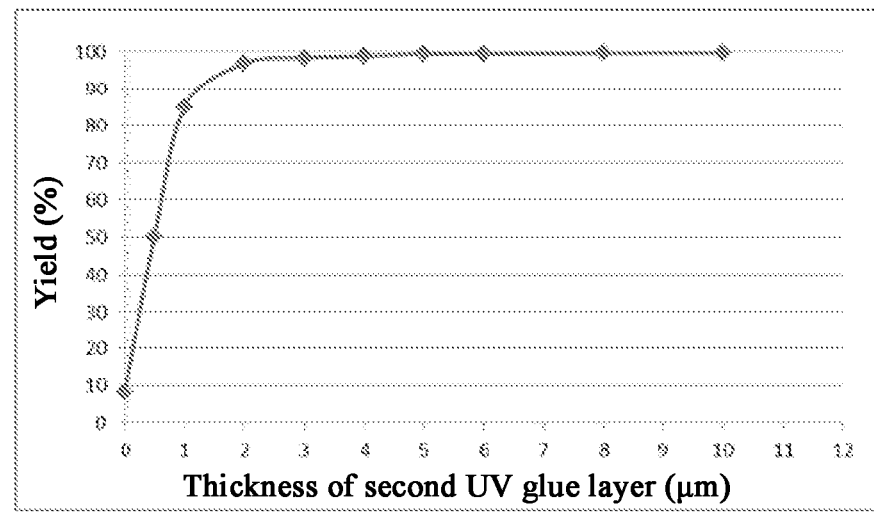
FIG. 5 is a curve diagram of the thickness and yield of the second UV glue layer according to one embodiment of the present invention.

Referring to FIG. 3 and FIG. 5, the thickness of the third UV glue layer 5 is 8 micrometers, and the depth of the second grid-shaped groove imprinted on the third UV glue layer 5 is 5 micrometers. It can be seen from FIG. 5 that when the thickness of the reinforced insulating support layer 4, that is, the second UV glue layer, is 5 micrometers or more than 5 micrometers, the yield is close to 100%. It should be noted that the yield mentioned here refers to the yield of testing the short circuit between the first conductive layer 3 and the second conductive layer 6 after the reinforced insulating support layer 4 is added. The higher the yield, the lower the probability of the short circuit between the two conductive layers.

Further, the material of the second UV glue layer 4 as the reinforced insulating support layer may be different from the material of the third UV glue layer 5, and the UV glue layers with different materials are easy to bond. In another embodiment, the material of the reinforced insulating support layer 4 and the material of the third UV glue layer 5 have a refractive index difference of less than 0.3, so that two materials with the same or similar refractive indexes will not or hardly reduce the light transmittance of the product. The grid-shaped grooves of the first UV glue layer 2 and the third UV glue layer 5 are formed by a pattern-imprinting tech-

| | Production data | | | | Environmental test data | | |
|---|---|---|---|---|---|---|---|
| Production batch | | Input (piece) | Output (piece) | Yield | Input (piece) | Qualified product (piece) | Rate of pass |
| Without insulating | I | 300 | 39 | 13% | 30 | 21 | 70% |
| support layer | II | 300 | 36 | 12% | 30 | 25 | 83% |
| | III | 300 | 42 | 14% | 30 | 22 | 73% |
| With insulating support | IV | 300 | 279 | 93% | 30 | 30 | 100% |
| layer (the present | V | 300 | 288 | 96% | 30 | 30 | 100% |
| invention) | VI | 300 | 282 | 94% | 30 | 30 | 100% |

The factor affecting the production yield of the above product is mainly product structure. The product without the reinforced insulating support layer 4 has the phenomenon of short circuit between upper and lower conductive layers, while the product with the reinforced insulating support layer 4 does not have this bad phenomenon.

Figure 2:
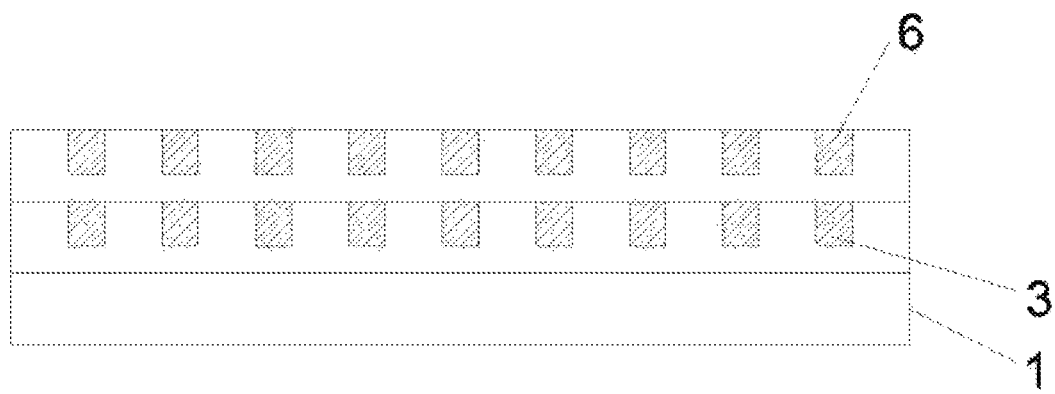
FIG. 2 is a schematic structural diagram of a transparent conductive film researched and developed as a reference example of the present invention.

A structure without the reinforced insulating support layer, that is, a structure in which a double-layer patterned transparent conductive film is directly disposed on a transparent substrate, as shown in FIG. 2, is a research and development reference example of the present invention. In the conductive film shown in FIG. 2, the transparent polymer layer may have a large number of small defects due to high-temperature treatment cracking, solvent volatilization, and defects formed in polymers. The conductive material of the upper conductive layer easily penetrates from the defects to the lower conductive layer, so that a short circuit is more likely to occur between the two conductive layers. Due to this short circuit problem, the product is unstable, the defect rate is very high, and it is impossible to achieve true industrialized scale production, especially when preparing large-size conductive films.

Figure 6:
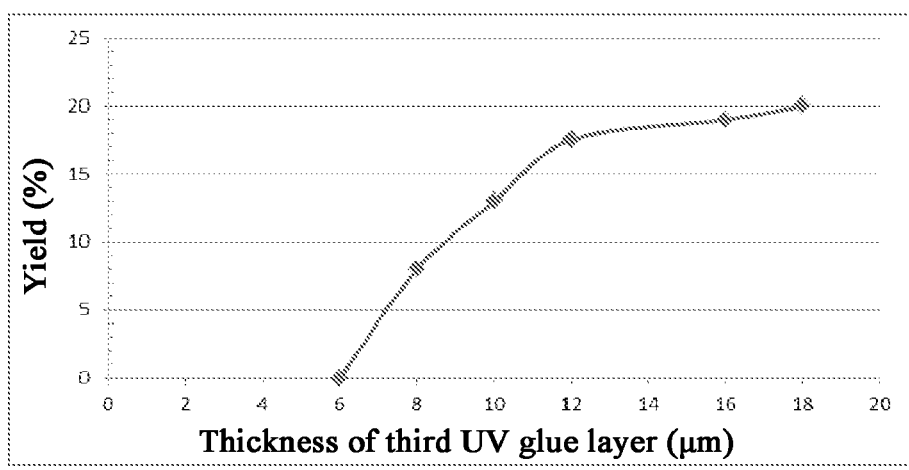
FIG. 6 is a curve diagram of the adjusted thickness and yield of the third UV glue layer without disposing the second UV glue layer.

According to the usual thinking, you can try to prevent the short circuit between the upper conductive layer and the lower conductive layer by increasing the thickness of the upper transparent glue layer as much as possible. However, it is found that the effect on improving the product stability and yield is very limited, as shown in FIG. 6, and the effect of bending resistance is not good.

nology, and the conductive material is a metallic conductive material, a non-metallic conductive material, preferably is the conductive material such as silver, copper or graphene.

In a preferred embodiment, the thickness of the first UV glue layer 2 is 8-12 micrometers, and the thickness of the first conductive layer 3 is 4-5 micrometers; the thickness of the third UV glue layer 5 is 8-12 micrometers, and the thickness of the second conductive layer 6 is 4-5 micrometers; and the thickness of the reinforced insulating support layer 4 is 5-10 micrometers.

Figure 7:
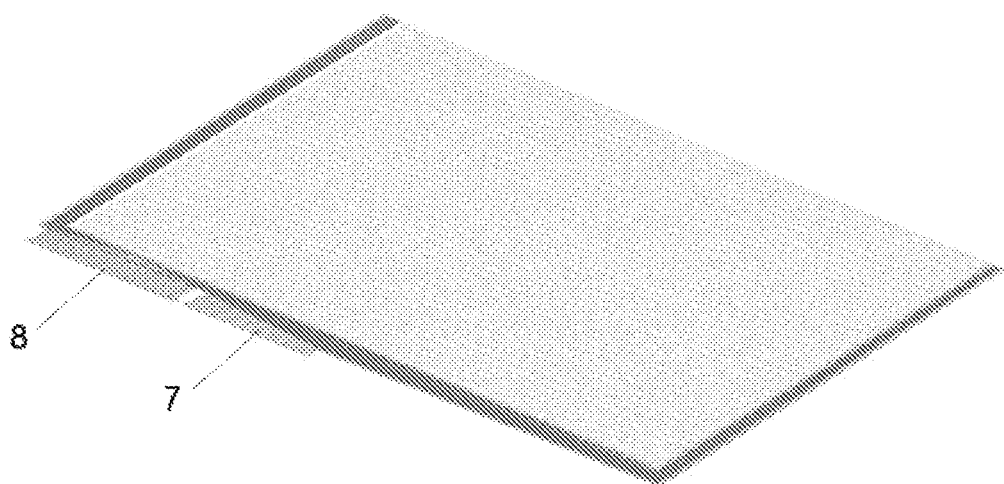
FIG. 7 is a schematic diagram of an electrical connection region of a first lead region of a first conductive layer and an electrical connection region of a second lead region of a second conductive layer.

In order to realize the multi-touch function, in addition to the conductive layer, each of the two transparent glue layers is also provided with a lead region for communicating the conductive layer with an external data processing device. The lead region is disposed on at least one side of the periphery of the conductive layer. An electrical connection region of the lead region is shown in FIG. 7, and the lead region is a region formed by convergence of a plurality of leads connected to the conductive layer.

The first UV glue layer 2 is provided with the first conductive layer 3 and a first lead region, and the first lead region is a region formed by convergence of a plurality of leads connected to the first conductive layer 3. The third UV glue layer 5 is provided with the second conductive layer 6 and a second lead region, and the second lead region is a region formed by convergence of a plurality of leads connected to the second conductive layer 6. The first UV glue layer 2 is pattern-imprinted and cured to form the first grid-shaped groove, a first lead groove, and a first alignment pattern groove. The first grid-shaped groove, the first lead groove, and the first alignment pattern groove are all filled with conductive materials to form the first conductive layer 3, the first lead region and a first alignment mark respectively. The surface of the third UV glue layer 5 is pattern-imprinted and cured to form the second grid-shaped groove, a second lead groove, and a second alignment pattern groove. The second grid-shaped groove, the second lead groove, and the second alignment pattern groove are all filled with conductive materials to form the second conductive layer 3, the second lead region and a second alignment mark respectively. The patterns of the first alignment mark and the second alignment mark are retained or cut in a transparent conductive film product. The electrical connection region 7 of the first lead region is not coated with a second layer of UV curing glue, and the electrical connection region 8 of the second lead region of the third UV glue layer 5 does not overlap with the electrical connection region 7 of the first lead region of the first UV glue layer 2.

According to the requirements of different applications, a second reinforced insulating support layer is provided on an upper surface of the third UV glue layer 3 in the present invention, and a polymer layer is provided on the second reinforced insulating support layer. The polymer layer is pattern-imprinted to form a third grid-shaped groove, the third grid-shaped groove are filled with conductive materials to form a third conductive layer, and the third conductive layer can be connected to a casing or grounded to serve as an electromagnetic shielding layer.

In one embodiment, the third conductive layer can also be connected to an external device to form a heating layer, so that the entire touch product is resistant to low temperature and can remain stable in a relatively low-temperature working environment.

In one embodiment, a third reinforced insulating support layer can be additionally provided on a surface of the third conductive layer as the electromagnetic shielding layer, a second polymer layer is provided on the third reinforced insulating support layer. The second polymer layer is pattern-imprinted to form a fourth grid-shaped groove, the fourth grid-shaped groove are filled with conductive materials to form a fourth conductive layer, and the fourth conductive layer can also be connected to an external device and then connected with current to form a heating layer. In this way, the entire conductive film product has four conductive layers. According to different application scenarios, especially in an environment where safety is emphasized or an environment where low temperature work is emphasized, two conductive layers can be used for touch display, one conductive layer is used as an electromagnetic shielding layer, and the other conductive layer is used as a heating layer, so that the product can be used in a low temperature environment without affecting the use of touch, and at the same time, electromagnetic shielding is safer, which is not shown in the drawing.

According to one aspect of the present invention, a preparation method of the above ultra-thin composite transparent conductive film is provided in the present invention. The preparation method includes the following operations.

In the first operation, a surface of a transparent substrate 1 is coated with a first layer of UV curing glue.

Before the surface of the transparent substrate 1 is coated with a first layer of UV curing glue, the transparent substrate 1 may be preferably aged. Of course, according to different materials, the transparent substrate 1 may not be aged, but some materials may have deviations in upper and lower line dimensions if they are not aged. The aging mode may be as follows: the transparent substrate 1 is processed under a plasma blower at a temperature of 50-150° C. for 5-60 s to remove impurities on the surface of the transparent substrate 1, so as to stabilize the properties of the transparent substrate 1; the material of the transparent substrate 1 may be PET, PC, PMMA, and the like, and the thickness of the transparent substrate 1 is 50-200 micrometers; the UV curing glue may also be replaced with thermosetting paint, but the UV glue is preferred.

In the second operation, the first layer of UV curing glue is pattern-imprinted and cured based on a pattern-imprinting technology to form a first UV glue layer 2 with a first grid-shaped groove and a first lead groove.

The pattern-imprinting mode may be as follows: the transparent substrate 1 is coated with the first layer of UV glue layer, a metallic convex mold with a graphical pattern is in contact with the transparent substrate by rolling or flat pressing, and ultraviolet curing is used to transfer the pattern on the surface of the convex mold to the first layer of UV glue at the same time or in a delayed manner, so as to form a graphical pattern with mesh lines as grooves on the first layer of UV glue. The edge lines of the graphical pattern are grooves, the width of the grooves is 1-20 micrometers, and the depth of the grooves is 4-5 micrometers. The thickness of the first UV glue layer 2 is 8-12 micrometers.

In the third operation, the grooves of the first UV glue layer 2 are filled with conductive materials to form the first conductive layer 3 and the first lead region.

In this operation, a scraping technology can be used to fill the patterned grooves of the first UV glue layer 2 with nano silver paste. According to the self-leveling effect, the nano silver paste is automatically deposited in the grooves during the process of scraping the silver paste. In order to allow the silver paste to be evenly distributed in the patterned grooves, it can be carried out through multiple scrapings to ensure that the grooves are filled with silver particles. After scraping, the surface of the UV curing glue needs to be polished to remove the excess silver paste. The first lead region is disposed at the periphery of the first conductive layer 3.

In the fourth operation, the surface of the first UV glue layer 2 is coated with a second layer of UV curing glue to form a second UV glue layer 4 as a reinforced insulating support layer. A flat mold without any pattern or a mirror roller with high surface smoothness can be used to press or coat the second layer of UV glue layer, which can ensure the surface flatness of the reinforced insulating support layer. The thickness of the reinforced insulating support layer 4 is preferably 5-10 micrometers. Since the first lead region needs to be communicated with an external device, in order to prevent subsequent processes from damaging the structure or electrical conductivity of the first lead region, the electrical connection region 7 of the first lead region cannot be coated with the second layer of UV glue. The second UV glue layer 4 can also be disposed by other modes such as selectively coating.

In the fifth operation, a third layer of UV curing glue is coated on the second UV glue layer 2, and the third layer of UV curing glue is pattern-aligned imprinted and cured to form a third UV glue layer 5 with a second grid-shaped groove and a second lead groove.

In order to ensure that there is no large deviation between the positions of the region of the second grid-shaped groove and the region of the first grid-shaped groove, molds for imprinting the first UV glue layer 2 and the third UV glue layer 5 are provided with positioning targets. There may be multiple positioning targets, which are respectively distributed around the molds and do not overlap with other patterns. When the third UV glue layer 5 is imprinted, the positioning target on the mold is aligned with the positioning target imprinted on the first UV glue layer 2. The first UV glue layer 2 is imprinted with a first alignment pattern groove. The first alignment pattern groove is filled with the conductive materials to form a first alignment mark. The third UV glue layer 5 is imprinted with a second alignment pattern groove. The patterns of the first alignment mark and the second alignment mark are retained or cut in a transparent conductive film product.

In the sixth operation, the grooves of the third UV glue layer 5 are filled with conductive materials to form a second conductive layer 6 and a second lead region. The second alignment pattern groove is filled with the conductive materials to form a second alignment mark.

The second lead region is disposed on the periphery of the second conductive layer 6, and the electrical connection region 8 of the second lead region cannot overlap with the electrical connection region 7 of the first lead region.

The function and performance of the ultra-thin composite transparent conductive film are tested by connecting the first lead region and the second lead region with a test apparatus.

The operations above mentioned are the preparation method of a single ultra-thin composite transparent conductive film.

Since there are many operations to prepare the above ultra-thin composite transparent conductive film, if the ultra-thin composite transparent conductive film is prepared singly, the efficiency is extremely low. The present embodiment is improved on the basis of the above preparation method, and provides a preparation method for mass production of the ultra-thin composite transparent conductive film. The preparation method includes the following main operations:

In the first operation, the surface of a roll of aged transparent substrate 1 is coated with a first layer of UV curing glue by a roll-to-roll process, subsequently, the first layer of UV curing glue is pattern-imprinted and cured to form a whole roll of film including a plurality of first UV glue layers 2 connected end to end, that is, a film of a plurality of continuous first UV glue layer units, and the first UV glue layer is provided with the first grid-shaped groove, the first lead groove, and grooves of a positioning target.

In the second operation, a plurality of scrapers are used to fill the first grid-shaped grooves and the first lead grooves of the plurality of first UV glue layers on the whole roll of film with conductive materials in a roll-to-roll scraping mode, so as to form a plurality of first conductive layers 3 and first lead regions.

The specific roll-to-roll scraping mode is as follows: the whole roll of film is moved under the traction of an automatic traction device, nozzles automatically spray conductive materials, a plurality of scrapers are perpendicular to the moving direction and are disposed above the film and are in contact with the film, the scrapers keep still, and the film moves, so that it will not cause waste of the conductive materials and save manpower. At the same time, an automatic wiping head can be disposed to wipe the excess conductive materials on the surface of the first UV glue layer.

In the third operation, by means of the roll-to-roll process, the surface of the first UV glue layer 2 is coated with a second layer of UV curing glue, and the second layer of UV curing glue is non-pattern-imprinted and cured, so as to form a plurality of reinforced insulating support layers 4, that is, second UV glue layers, on the surfaces of a plurality of first UV glue layers of the whole roll of film, wherein the surface of the electrical connection region 7 of the first lead region of the first UV glue layer 2 is not coated with a UV glue layer.

In the fourth operation, after the positioning target imprinted on the mold of the third UV glue layer 5 and the positioning target imprinted on the first UV glue layer 2 are aligned, by means of the roll-to-roll process, the second UV glue layers 4 (reinforced insulating support layers) of the whole roll of film are coated with a third layer of UV curing glue, and the UV curing glue is pattern-imprinted and cured, so as to form a whole roll of film including a plurality of third UV glue layers 5 connected end to end, wherein the third UV glue layer 5 is provided with the second grid-shaped groove and the second lead groove.

Due to the aligning treatment, the regions of the second grid-shaped groove of the plurality of second conductive layers of the whole roll of film are respectively disposed right above the regions of the first grid-shaped groove of the plurality of first conductive layers, and the electrical connection regions 8 of all second lead regions are staggered from the electrical connection regions 7 of the first lead regions.

In the fifth operation, a plurality of scrapers are used to fill the grooves of the plurality of third UV glue layers 5 of the whole roll of film with conductive materials in a roll-to-roll scraping mode, so as to form a plurality of second conductive layers 6 and second lead regions.

In the sixth operation, the whole roll of ultra-thin composite transparent conductive film is sliced to obtain a plurality of ultra-thin composite transparent conductive films.

The above preparation method can realize mass production of ultra-thin composite transparent conductive films, and the production efficiency is high. Moreover, by roll-to-roll scraping of the conductive materials, the waste of the conductive materials can be reduced, and the production cost can be reduced. Taking nano silver paste as an example, a 500-milliliter bottle of nano silver paste requires tens of thousands of RMB Yuan.

Second Embodiment

Figure 4:
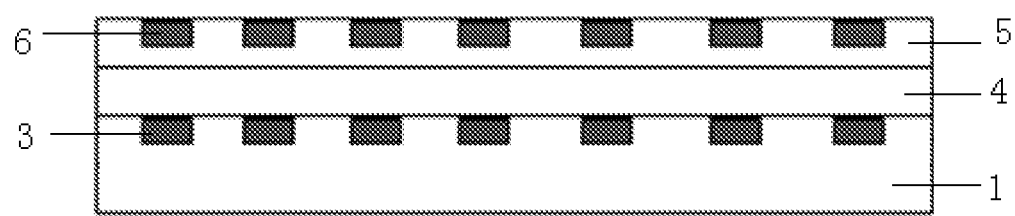
FIG. 4 is a schematic structural diagram of the ultra-thin composite transparent conductive film according to a second embodiment of the present invention.

As shown in FIG. 4, an ultra-thin composite transparent conductive film provided according to a second embodiment of the present invention, includes a transparent substrate 1, a first conductive layer 3 disposed on the transparent substrate 1, and a second conductive layer 6 disposed on the first conductive layer 3. A transparent reinforced insulating support layer 4 is disposed between the first conductive layer 3 and the second conductive layer 6, and the second conductive layer 6 is disposed on the cured reinforced insulating support layer 4.

The difference between the first embodiment and the second embodiment is that the first conductive layer 3 in the second embodiment is formed by filing conductive material filled in the first grid-shaped groove formed in the transparent substrate 1, instead of in the first grid-shaped groove formed in the first UV glue layer 2.

It should be noted that compared with the first embodiment, in the second embodiment, the first UV glue layer 2 is removed, which is equivalent to that the thickness of the ultra-thin composite transparent conductive film is smaller. However, the effect of imprinting the grid-shaped groove directly in the transparent substrate 1 is not as good as imprinting the grid-shaped groove in the UV glue layer, because the UV glue layer is still in a liquid state when being imprinted, it will be cured after imprinting, and the groove depth will not rebound.

A preparation method for the above ultra-thin composite transparent conductive film is provided according to the second embodiment of the present invention. The preparation method includes the following main operations:

(1), a grid-shaped groove are pattern-imprinted on the transparent substrate 1;

(2), the grooves imprinted in the operation (1) are filled with conductive materials to form a first conductive layer 3;

(3), the first conductive layer 3 is coated with a second UV glue layer, that is, a transparent reinforced insulating support layer 4, and the transparent reinforced insulating support layer is cured;

(4), the transparent reinforced insulating support layer 4 is coated with a third UV glue layer 5, and the grid-shaped grooves are pattern-imprinted and cured on the third UV glue layer 5; and (5), the grooves imprinted in the operation (4) are filled with conductive materials to form a second conductive layer 6.

In the above operation (1), a mold can be used to directly impress grid-shaped groove on a transparent substrate (which may be PET or PMMA), and the groove depth is 4-5 micrometers. The specific implementations and parameters of the other operations refer to the preparation method according to the first embodiment of the present invention.

It should be noted that the size parameters exemplified in each of the above embodiments are only for illustrating the implementation state of the present invention. Taking the width of the groove as an example, as long as the width of the groove is smaller than the limiting resolution of the human eye, it does not affect normal viewing as a display device. The foregoing descriptions are merely preferred embodiments of the present invention but are not intended to limit the patent scope of the present invention. Any equivalent modifications made to the structures or processes based on the content of the specification and the accompanying drawings of the present invention for direct or indirect use in other relevant technical fields shall also be encompassed in the patent protection scope of the present invention.

What is claimed is:

1. An ultra-thin composite transparent conductive film, comprising:
    a transparent substrate;
    a first UV glue layer disposed on one side of the transparent substrate, pattern-imprinted and cured to form a first grid-shaped groove, the first grid-shaped groove being filled with conductive materials to form a first conductive layer;
    a second UV glue layer disposed on one side of the first UV glue layer away from the transparent substrate and used as a reinforced insulating support layer; and
    a third UV glue layer disposed on one side of the second UV glue layer away from the transparent substrate, pattern-imprinted and cured to form a second grid-shaped groove, the second grid-shaped groove being filled with conductive materials to form a second conductive layer,
    wherein a friction coefficient of cured surfaces of the first UV glue layer and the third UV glue layer is lower than a friction coefficient of cured surfaces of the second UV glue layer, and
    wherein a thickness of the reinforced insulating support layer is in a range of 5-10 micrometers.

2. The ultra-thin composite transparent conductive film according to claim 1, wherein the first UV glue layer is pattern-imprinted and cured to form the first grid-shaped groove, a first lead groove, and a first alignment pattern groove, the first alignment pattern groove is filled with conductive materials to form a first alignment mark, the first lead groove is filled with conductive materials to form a first lead region, respectively and the depth of the first grid-shaped groove, the first lead groove, and the first alignment pattern groove is smaller than the thickness of the first UV glue layer;
    the third UV glue layer is pattern-imprinted and cured to form the second grid-shaped groove, a second lead groove, and a second alignment pattern groove, the second alignment pattern groove is filled with conductive materials to form a second alignment mark, the second lead groove is filled with conductive materials to form a second lead region, respectively and the depth of the second grid-shaped groove, the second lead groove, and the second alignment pattern groove is not greater than the thickness of the third UV glue layer; and
    patterns of the first alignment mark and the second alignment mark are retained or cut in a transparent conductive film product.

3. The ultra-thin composite transparent conductive film according to claim 2, wherein an electrical connection region of the first lead region is not covered with the second UV glue layer, and an electrical connection region of the second lead region does not overlap with the electrical connection region of the first lead region.

4. The ultra-thin composite transparent conductive film according to claim 2, wherein the second UV glue layer is a composite layer formed by coating UV curing glue on the one side of the first UV glue layer multiple times, the electrical connection region of the first lead region is not covered with the second UV glue layer, the third UV glue layer is formed by coating a layer of UV curing glue on the one side of the second UV glue layer, and the first UV glue layer is formed by coating a layer of UV curing glue on the one side of the transparent substrate.

5. The ultra-thin composite transparent conductive film according to claim 2, wherein the first grid-shaped groove, the second grid-shaped groove, the first lead groove, and the second lead groove are filled with nano silver paste, nano copper paste, graphene materials, nano silver wires or carbon nanotube materials.

6. The ultra-thin composite transparent conductive film according to claim 2, further comprising: a protective layer provided on an upper surface of the third UV glue layer, wherein the protective layer is a polymer layer, the first UV glue layer, the second UV glue layer, the third UV glue layer, the protective layer, and the transparent substrate together form a composite transparent conductive film, and the electrical connection region of the second lead region does not overlap with the electrical connection region of the first lead region.

7. The ultra-thin composite transparent conductive film according to claim 1, wherein materials of the second UV glue layer and the third UV glue layer are different, and materials of the first UV glue layer and the third UV glue layer are the same or different.

8. The ultra-thin composite transparent conductive film according to claim 1, wherein
    a tackifying layer is coated or a tackifying process is performed between the transparent substrate and the first UV glue layer; and/or a tackifying layer is coated or a tackifying process is performed between the first UV glue layer and the second UV glue layer; and/or a tackifying layer is coated or a tackifying process is performed between the second UV glue layer and the third UV glue layer.

9. A preparation method for an ultra-thin composite transparent conductive film, comprising:

coating on one side of a transparent substrate with a first layer of UV curing glue, and pattern-imprinting and curing the first layer of UV curing glue to form a first grid-shaped groove, a first lead groove, and a first alignment pattern groove;

filling the first grid-shaped groove, the first lead groove, and the first alignment pattern groove with conductive materials to form a first conductive layer, a first lead region and a first alignment marker respectively so that a first UV glue layer is obtained, depth of the first grid-shaped groove and the first lead groove being smaller than a thickness of the first UV glue layer;

coating one side of the first UV glue layer with a second layer of UV curing glue selectively to form a second UV glue layer, an electrical connection region of the first lead region being not coated with the second layer of UV curing glue;

coating one side of the second UV glue layer with a third layer of UV curing glue, and pattern-aligned imprinting and curing the third layer of UV curing glue to form a second grid-shaped groove, a second lead groove, and a second alignment pattern groove; and filling the second grid-shaped groove, the second lead groove, and the second alignment pattern groove with conductive materials to form a second conductive layer, a second lead region and a second alignment marker respectively so that a third UV glue layer is obtained, depth of the second grid-shaped groove and the second lead groove being not greater than a thickness of the third UV glue layer, and an electrical connection region of the second lead region not overlapping with the electrical connection region of the first lead region, wherein a friction coefficient of cured surfaces of the first UV glue layer and the third UV glue layer is lower than a friction coefficient of cured surfaces of the second UV glue layer, and wherein a thickness of the second UV glue layer is in a range of 5-10 micrometers.

10. A touch display panel, comprising:
a display device; and
an ultra-thin composite transparent conductive film comprising:
  a transparent substrate;
  a first UV glue layer disposed on one side of the transparent substrate, pattern-imprinted and cured to form a first grid-shaped groove, the first grid-shaped groove being filled with conductive materials to form a first conductive layer;
  a second UV glue layer disposed on one side of the first UV glue layer away from the transparent substrate and used as a reinforced insulating support layer; and
  a third UV glue layer disposed on one side of the second UV glue layer away from the transparent substrate, pattern-imprinted and cured to form a second grid-shaped groove, the second grid-shaped groove being filled with conductive materials to form a second conductive layer,
  wherein a friction coefficient of cured surfaces of the first UV glue layer and the third UV glue layer is lower than a friction coefficient of cured surfaces of the second UV glue layer, and
  wherein a thickness of the reinforced insulating support layer is in a range of 5-10 micrometers.

11. A touch panel, comprising:
a glass cover plate;
a first UV glue layer formed by coating a layer of UV curing glue on one side of the glass cover plate, pattern-imprinted and cured to form a first grid-shaped groove, the first grid-shaped groove being filled with conductive materials to form a first conductive layer respectively;
a second UV glue layer disposed on one side of the first UV glue layer away from the glass cover plate and used as a reinforced insulating support layer; and
a third UV glue layer disposed on one side of the second UV glue layer away from the glass cover plate, pattern-imprinted and cured to form a second grid-shaped groove, the second grid-shaped groove being filled with conductive materials to form a second conductive layer,
wherein a friction coefficient of cured surfaces of the first UV glue layer and the third UV glue layer is lower than a friction coefficient of cured surfaces of the second UV glue layer, and
wherein a thickness of the reinforced insulating support layer is in a range of 5-10 micrometers.

12. A large-size touch all-in-one machine apparatus, comprising:
a CPU;
a power supply;
a display device comprising a touch panel comprising an ultra-thin composite transparent conductive film, the ultra-thin composite transparent conductive film comprising:
  a transparent substrate;
  a first UV glue layer formed by coating a layer of UV curing glue on one side of the transparent substrate, pattern-imprinted and cured to form a first grid-shaped groove, the first grid-shaped groove being filled with conductive materials to form a first conductive layer;
  a second UV glue layer disposed on one side of the first UV glue layer away from the transparent substrate and used as a reinforced insulating support layer; and
  a third UV glue layer disposed on one side of the second UV glue layer away from the transparent substrate, pattern-imprinted and cured to form a second grid-shaped groove, the second grid-shaped groove being filled with conductive materials to form a second conductive layer,
  wherein a friction coefficient of cured surfaces of the first UV glue layer and the third UV glue layer is lower than a friction coefficient of cured surfaces of the second UV glue layer, and
  wherein a thickness of the reinforced insulating support layer is in a range of 5-10 micrometers.

13. A composite transparent conductive film, comprising:
a transparent substrate having a first grid-shaped groove formed by pattern-imprinting one side thereof, the first grid-shaped groove being filled with conductive materials to form a first conductive layer;
a second UV glue layer disposed on the one side of the transparent substrate and used as a reinforced insulating support layer, and an electrical connection region of the first lead region being not coated with the second UV glue layer; and
a third UV glue layer disposed on one side of the second UV glue layer away from the transparent substrate, pattern-imprinted and cured to form a second grid-shaped groove, the second grid-shaped groove being filled with conductive materials to form a second conductive layer, wherein a friction coefficient of cured surfaces of the first UV glue layer and the third UV glue layer is lower than a friction coefficient of cured surfaces of the second UV glue layer, and wherein a thickness of the reinforced insulating support layer is in a range of 5-10 micrometers.

* * * * *